United States Patent
Tanaka et al.

(10) Patent No.: US 11,101,080 B2
(45) Date of Patent: Aug. 24, 2021

(54) PHOTOELECTRIC CONVERSION ELEMENT AND SOLAR CELL

(71) Applicant: RICOH COMPANY, LTD., Tokyo (JP)

(72) Inventors: Yuuji Tanaka, Shizuoka (JP); Tamotsu Horiuchi, Shizuoka (JP); Naomichi Kanei, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/829,356

(22) Filed: Mar. 25, 2020

(65) Prior Publication Data

US 2020/0273630 A1  Aug. 27, 2020

Related U.S. Application Data

(63) Continuation of application No. 15/120,464, filed as application No. PCT/JP2015/052684 on Jan. 30, 2015, now Pat. No. 10,636,579.

(30) Foreign Application Priority Data

Feb. 24, 2014 (JP) .................................. 2014-032566
Apr. 16, 2014 (JP) .................................. 2014-084832

(51) Int. Cl.
*H01G 9/20* (2006.01)
*H01L 51/00* (2006.01)
*H01L 51/42* (2006.01)

(52) U.S. Cl.
CPC ........... *H01G 9/2018* (2013.01); *H01G 9/209* (2013.01); *H01G 9/2027* (2013.01);
(Continued)

(58) Field of Classification Search
CPC .. H01G 9/2017; H01G 9/2018; H01G 9/2059; H01G 9/209; H01L 51/422;
(Continued)

(56) References Cited

U.S. PATENT DOCUMENTS 4,927,721 A   5/1990   Gratzel et al.
6,084,176 A   7/2000   Shiratsuchi et al.
(Continued)

FOREIGN PATENT DOCUMENTS

CN   102290257   12/2011
JP   2664194     6/1997
(Continued)

OTHER PUBLICATIONS

Schölin, Rebecka, et al.; Energy level Shifts in Spiro-OMeTAD Molecular Thin Films when Adding Li-TFSI; J. Phys. Chem. C; 2012, 116, 26300-26305 (Year: 2012).*
(Continued)

*Primary Examiner* — Edward J. Schmiedel
(74) *Attorney, Agent, or Firm* — Grüneberg and Myers PLLC

(57) ABSTRACT

Provided is a photoelectric conversion element including a first electrode, a hole blocking layer, an electron transport layer, a first hole transport layer, and a second electrode, wherein the first hole transport layer includes at least one of basic compounds represented by general formula (1a) and general formula (1b) below:

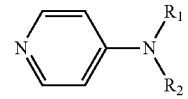

General formula (1a)

General formula (1b)

(Continued)

where in the formula (1a) or (1b), $R_1$ and $R_2$ represent a substituted or unsubstituted alkyl group or aromatic hydrocarbon group and may be identical or different, and $R_1$ and $R_2$ may bind with each other to form a substituted or unsubstituted heterocyclic group containing a nitrogen atom.

15 Claims, 1 Drawing Sheet

(52) U.S. Cl.
CPC ......... *H01G 9/2059* (2013.01); *H01L 51/002* (2013.01); *H01L 51/0061* (2013.01); *H01L 51/0067* (2013.01); *H01L 51/422* (2013.01); *H01L 51/4226* (2013.01); *H01L 51/4233* (2013.01); *H01L 51/006* (2013.01); *H01L 51/0056* (2013.01); *H01L 51/0069* (2013.01); *H01L 51/0072* (2013.01); *Y02E 10/549* (2013.01)

(58) Field of Classification Search
CPC ............. H01L 51/4226; H01L 51/4233; H01L 51/0069; H01L 51/0072
See application file for complete search history.

(56) References Cited

U.S. PATENT DOCUMENTS

| | | | |
|---|---|---|---|
| 10,566,105 | B2 | 2/2020 | Ishitsuka et al. |
| 2009/0114277 | A1 | 5/2009 | Arakawa et al. |
| 2011/0139253 | A1 | 6/2011 | Wachi |
| 2012/0090679 | A1 | 4/2012 | Chittibabu et al. |
| 2012/0177813 | A1 | 7/2012 | Thompson et al. |
| 2012/0192936 | A1 | 8/2012 | Girt |
| 2013/0037753 | A1 | 2/2013 | Ishitsuka et al. |
| 2013/0125987 | A1 | 5/2013 | Kawasaki et al. |
| 2014/0034940 | A1* | 2/2014 | Yu ...................... H01L 51/0067 257/40 |
| 2015/0122314 | A1* | 5/2015 | Snaith ................. H01L 51/4213 136/255 |
| 2020/0143954 | A1 | 5/2020 | Ishitsuka et al. |

FOREIGN PATENT DOCUMENTS

| | | |
|---|---|---|
| JP | 11-144773 | 5/1999 |
| JP | 2000-106223 | 4/2000 |
| JP | 2004-047229 | 2/2004 |
| JP | 2004047229 A * | 2/2004 |
| JP | 4446011 | 1/2010 |
| JP | 2011-162644 A | 8/2011 |
| JP | 2011-181286 | 9/2011 |
| JP | 2012-199023 A | 10/2012 |
| JP | 2012-204276 A | 10/2012 |
| JP | 2013-10996 5 | 6/2013 |
| JP | 2014-140000 | 7/2014 |
| KR | 10-2011-0129959 A | 12/2011 |
| KR | 10-2013-0007640 A | 1/2013 |
| WO | WO 2010/107795 A | 9/2010 |
| WO | WO-2013171518 A1 * | 11/2013 ......... H01L 51/0032 |

OTHER PUBLICATIONS

Premaratne, K., et al.; Highly efficient, optically semi-transparent, ZnO-based dye-sensitized solar cells with Indoline D-358 in the dye; Journal of Photochemistry and Photobiology A: Chemistry 229 (2012) 29-32 (Year: 2012).*
Korean Office Action dated Aug. 4, 2020 in Patent Application No. 10-2020-7013591 (with English translation), 10 pages.
Office Action dated Jun. 16, 2020 in corresponding Japanese Patent Application No. 2018-246911; 3 pages.
International Search Report dated Mar. 31, 2015 for counterpart International Patent Application No. PCT/JP2015/052684 filed Jan. 30, 2015.
Nature, 353 (1991) 737.
J. Am. Chem. Soc., 115 (1993) 6382.
Semicond. Sci. TechnoL, 10 (1995) 1689.
Electrochemistry, 70 (2002) 432.
Synthetic Metals, 89 (1997) 215.
Nature, 398 (1998) 583.
Chem. Lett., (1997) 471.
Panasonic Technical Report, 56 (2008) 87.
Fujikura Technical Report, 121 (2011) 42.
Solar Energy Materials & Solar Cells, 181 (2004) 87.
J. Org. Chem., 67 (2002) 3029.
H. Kusama et al., Influence of alkylamlnopyridine additives in electrolytes on dye.sensitized solar cell performance, Solar Energy Materials and Solar Cells, 2004, vol. 81, No. 1, pp. 87-99.
European Search Report dated Feb. 10, 2017 in connection with corresponding European Patent Application No. 15752787.0.
Japanese Office Action dated Dec. 24, 2019, Japanese Patent Application No. 2018-246911 (with English Translation).
Jessica Kruger et al., "High efficiency solid-state photovoltaic device due to inhibition of interface charge recombination", Applied Physics Letters, 2001, vol. 79, pp. 2085-2087.
Ossila.com; Spiro-OMeTAD; https://www.ossila.com/products/spiro-ometad; accessed and printed Jul. 28, 2018 (Year: 2015).
Hwang, J, et al.; Electrochromic and electrochemical properties of 3-pyridinyl and 1, 10-phenanthroline bearing poly(2,5-di(2-thienyl)-1 H-pyrrole) derivatives; Solar Energy Materials and Solar Cells; vol. 94, Issue 7; 201 0; pp. 1286-1292 (Year: 2010).
Kumara, G.R.A., et al.; Efficient solid-state dye-sensitized n-ZnO/ D-358 dye/p-CuI solar cell; Electrochimica Acta 94 (2013) 34-37 (Year: 2013).
Sigma-Aldrich; D358 Dye; accessed and printed Sep. 20, 2017; http://www.sigmaaldrich.com/catalog/product/aldrich/746606?lang=en&region=US (Year: 2017).

\* cited by examiner

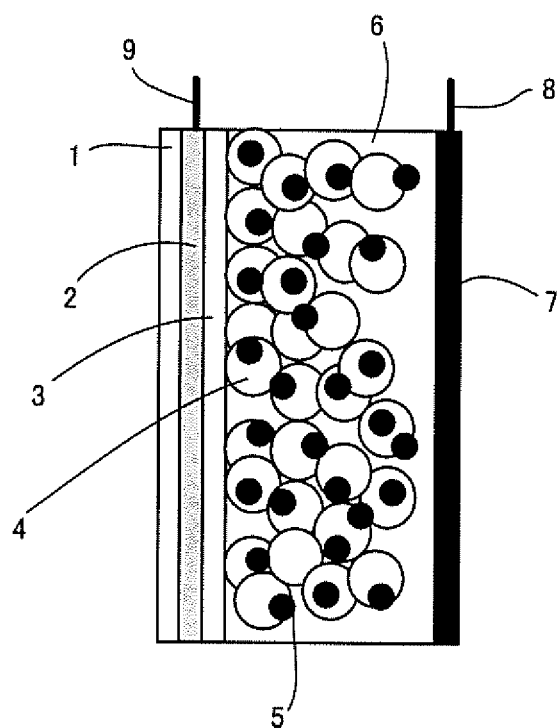

PHOTOELECTRIC CONVERSION ELEMENT AND SOLAR CELL

CROSS-REFERENCE TO RELATED APPLICATIONS

This application is a continuation of U.S. patent application Ser. No. 15/120,464, filed on Aug. 19, 2016, which is the National Stage of the International Patent Application No. PCT/JP2015/052684, filed Jan. 30, 2015, and claims priority to Japanese Application No. 2014-032566, filed Feb. 24, 2014 and Japanese Application No. 2014-084832, filed on Apr. 16, 2014, the disclosures of all of which are incorporated herein by reference in their entireties.

TECHNICAL FIELD

The present invention relates to a method for producing a photoelectric conversion element and a solar cell.

BACKGROUND ART

In recent years, solar cells have been increasing importance as alternative energy for fossil fuels and as a measure against global warming. However, existing solar cells represented by silicon-based solar cells are expensive under the current circumstances, and the expensiveness is a factor that prohibits popularization.

Hence, research and development for various low-cost solar cells is promoted. Among such solar cells, dye-sensitized solar cells proposed by Graetzel et al. from Swiss Federal Institute of Technology in Lausanne are highly expected for reduction to practical use (see, e.g., Patent document 1 and Non-patent documents 1 and 2).

The structure of the solar cells is formed of: a porous metal oxide semiconductor on a transparent conductive glass substrate; a dye adsorbed to a surface of the porous metal oxide semiconductor; an electrolyte containing a redox couple; and a counter electrode.

The dye-sensitized solar cells of Patent document 1 and Non-patent documents 1 and 2 are remarkably improved in photoelectric conversion efficiency by being increased in surface area using a porous material as the electrode formed of the metal oxide semiconductor such as titanium oxide and by having a ruthenium complex monomolecularly adsorbed as the dye.

Further, it is expected that the production costs can be reduced, because a printing technique can be applied as the method for producing the photoelectric conversion element and no expensive production facilities are needed hence. However, the solar cells contain iodine and a volatile solvent and have problems that the power generating efficiency may drop due to deterioration of the iodine redox system and that the electrolytic solution may volatilize or leak.

As compensation for these disadvantages, the following solid dye-sensitized solar cells are proposed:

1) Solid dye-sensitized solar cells using an inorganic semiconductor (see, e.g., Non-patent documents 3 and 4);

2) Solid dye-sensitized solar cells using a low-molecular-weight organic hole transport material (see, e.g., Patent document 2 and Non-patent documents 5 and 6); and 3) Solid dye-sensitized solar cells using a conductive polymer (see, e.g., Patent document 3 and Non-patent document 7).

The solar cell described in Non-patent document 3 uses copper iodide as a material to constitute a p-type semiconductor layer. This solar cell has a relatively good photoelectric conversion efficiency immediately after production, but it is known that the photoelectric conversion efficiency drops by half in a few hours due to deterioration attributed to, for example, increase of crystal grains of copper iodide.

Hence, the solar cell described in Non-patent document 4 additionally contains imidazolinium thiocyanato to suppress crystallization of copper iodide. However, the suppression is not sufficient.

The solid dye-sensitized solar cell that is described in Non-patent document 5 and is of a type using an organic hole transport material is reported by Hagen et al. and improved by Graetzel et al. (see Non-patent document 6).

The solid dye-sensitized solar cell described in Patent document 2 and using a triphenylamine compound includes a charge transport layer formed by vacuum vapor deposition of the triphenylamine compound.

Hence, the triphenylamine compound cannot reach internal voids in the porous semiconductor. Therefore, it has only been possible to obtain a low conversion efficiency.

In the example described in Non-patent document 6, a spiro-type hole transport material is dissolved in an organic solvent, and spin-coating is employed to obtain a composite body of nano-titania particles with the hole transport material.

In this solar cell, however, an optimum value of the thickness of a nano-titania particle film is specified to be about 2 µm, which is by far smaller than when an iodine electrolytic solution is used, i.e., from 10 µm through 20 µm. Hence, an amount of the dye adsorbed to the titanium oxide is low, to make it difficult to achieve sufficient light absorption and sufficient carrier generation. Hence, it is impossible to reach the characteristic obtained when an electrolytic solution is used.

As a solid solar cell of the type using a conductive polymer, a solid solar cell using polypyrrole has been reported by Yanagida et al. from Osaka University (see Non-patent document 7). This solid solar cell has also been able to obtain only a low conversion efficiency. A solid dye-sensitized solar cell described in Patent document 3 and using a polythiophene derivative includes a charge transfer layer formed by electrolytic polymerization on a dye-adsorbed porous titanium oxide electrode. However, there are problems that the dye may desorb from the titanium oxide and that the dye may decompose. Furthermore, the polythiophene derivative is considerably problematic in durability.

Owing to recent technological developments, driving power for electronic circuits has been significantly reduced, and it has become possible to drive various electronic parts such as sensors by converting weak light such as room light to electricity.

Further, it has been reported that existing electrolytic solution-type dye-sensitized solar cells using, for example, iodine, have a photoelectric conversion characteristic greater than or equal to amorphous silicon solar cells under weak room light (see Non-patent document 8).

However, the electrolytic solution-type dye-sensitized solar cells contain iodine and a volatile solvent described above and have problems that the power generating efficiency may drop due to deterioration of the iodine redox system and that the electrolytic solution may volatilize or leak.

It has also been reported that when weak light such as room light is converted to electricity, loss current due to an internal resistance in the photoelectric conversion element is conspicuous (see Non-patent document 9).

When the internal resistance is raised, a short-circuiting current density worsens to degrade the photoelectric conversion characteristic. When the internal resistance is lowered, an open circuit voltage worsens to degrade the photoelectric conversion characteristic. That is, it is extremely difficult to satisfy both of; raising the internal resistance; and a good photoelectric conversion characteristic.

An open circuit voltage obtained with the photoelectric conversion element under weak light such as the room light is lower than under pseudo sunlight. Hence, in order to obtain an output voltage needed for driving an electronic circuit, there is a need for obtaining a high open circuit voltage.

Hitherto, there have been reported basic substances that can achieve a high open circuit voltage (see Non-patent document 10). However, there is no basic material that can achieve a photoelectric conversion characteristic better than hitherto used 4-tertial butylpyridine in a dye-sensitized solar cell of the type using an electrolytic solution such as iodine.

As described above, under the current circumstances, none of the solid photoelectric conversion elements studied so far have been able to obtain a satisfactory characteristic.

CITATION LIST

Patent Document

Patent document 1: Japanese Patent No. 2664194
Patent document 2: Japanese Unexamined Patent Application Publication No. 11-144773
Patent document 3: Japanese Unexamined Patent Application Publication No. 2000-106223

Non-Patent Document

Non-patent document 1: Nature, 353 (1991) 737
Non-patent document 2: J. Am. Chem. Soc., 115 (1993) 6382
Non-patent document 3: Semicond. Sci. Technol., 10 (1995) 1689
Non-patent document 4: Electrochemistry, 70 (2002) 432
Non-patent document 5: Synthetic Metals, 89 (1997) 215
Non-patent document 6: Nature, 398 (1998) 583
Non-patent document 7: Chem. Lett., (1997) 471
Non-patent document 8: Panasonic Technical Report, 56 (2008) 87
Non-patent document 9: Fujikura Technical Report, 121 (2011) 42
Non-patent document 10: Solar Energy Materials & Solar Cells, 181 (2004) 87
Non-patent document 11: J. Org. Chem, 67 (2002) 3029

SUMMARY OF INVENTION

Technical Problem

The present invention has an object to solve the problems described above and provide a solid photoelectric conversion element having a better photoelectric conversion characteristic than hitherto obtained.

Solution to Problem

As a result of earnest studies for solving the problems described above, it has been found possible to provide a high-performance solid photoelectric conversion element by making a hole transport layer contain a specific basic compound. The present invention has been arrived at on the basis of this finding.

That is, the problems are solved by a photoelectric conversion element including a first electrode, a hole blocking layer, an electron transport layer, a first hole transport layer, and a second electrode, wherein the first hole transport layer contains at least one of basic compounds represented by a general formula (1a) and a general formula (1b) below.

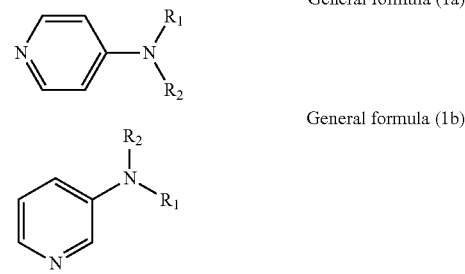

General formula (1a)

General formula (1b)

In the formula (1a) or (1b), $R_1$ and $R_2$ represent a substituted or unsubstituted alkyl group or aromatic hydrocarbon group and may be identical or different, and $R_1$ and $R_2$ may bind with each other to form a substituted or unsubstituted heterocyclic group containing a nitrogen atom.

Effects of the Invention

The present invention can provide a solid photoelectric conversion element having a better photoelectric conversion characteristic than hitherto obtained.

BRIEF DESCRIPTION OF THE DRAWINGS

FIG. 1 is an example schematic view illustrating a cross-section of a structure of a photoelectric conversion element of the present invention orthogonal to a layer deposition direction.

MODE FOR CARRYING OUT THE INVENTION

A configuration of a photoelectric conversion element and a solar cell will be described below with reference to FIG. 1.

FIG. 1 is an exemplary schematic view illustrating a cross-section of the photoelectric conversion element and the solar cell orthogonal to a layer deposition direction.

In the embodiment illustrated in FIG. 1, the configuration includes a first electrode 2 on a substrate 1, a hole blocking layer 3 formed of titanium oxide, an electron transport layer 4, a photosensitizing material 5 adsorbed to the electron transport layer, and a hole transport layer 6 provided between the photosensitizing material and a second electrode 7.

<First Electrode>

The first electrode 2 is not particularly limited so long as the first electrode 2 is a conductive material transparent to visible light. It is possible to use known conductive materials used in, for example, typical photoelectric conversion elements or liquid crystal panels.

Examples of the material of the first electrode 2 include indium tin oxide (hereinafter referred to as ITO), fluorine-doped tin oxide (hereinafter referred to as FTO), antimony-doped tin oxide (hereinafter referred to as ATO), indium zinc oxide, niobium titanium oxide, and graphene. One of these materials may be deposited alone or more than one of these materials may be laminated.

A thickness of the first electrode 2 is preferably from 5 nm through 100 μm and more preferably from 50 nm through 10 μm.

It is preferable that the first electrode 2 be provided on the substrate 1 formed of a material transparent to visible light, in order to maintain a constant hardness. For example, glass, a transparent plastic plate, a transparent plastic film, or an inorganic transparent crystalline substance is used for the substrate 1.

It is also possible to use a known integrated body of the first electrode 2 and the substrate 1. Examples of the integrated body include FTO-coated glass, ITO-coated glass, zinc oxide: aluminium-coated glass, a FTO-coated transparent plastic film, and an ITO-coated transparent plastic film.

It is also possible to use a product in which a transparent electrode of tin oxide or indium oxide doped with a cation or an anion different in valence or a metal electrode formed into a light-transmissive structure such as a mesh form and a stripe form is provided on a substrate such as a glass substrate.

One of these materials may be used alone or two or more of these materials may be mixed together or laminated. Furthermore, with a view to lowering a resistance, for example, a metal lead line may be used in combination.

Examples of the material of the metal lead line include metals such as aluminium, copper, silver, gold, platinum, and nickel. The metal lead line can be formed by a method of locating the metal lead line on the substrate 1 by, for example, vapor deposition, sputtering, or pressure bonding and providing the ITO or the FTO on the metal lead line.

<Hole Blocking Layer>

The hole blocking layer 3 is not particularly limited so long as the hole blocking layer is transparent to visible light and is an electron transport material. However, titanium oxide is particularly preferable. In order to suppress loss current to achieve usability under weak light such as room light, there is a need that a high internal resistance be provided, and a film forming method of titanium oxide to form the hole blocking layer 3 is also important.

Examples of typical methods for forming a film of the titanium oxide include a sol-gel method and a titanium tetrachloride hydrolyzing method, which are wet film formation. However, a resistance obtained is slightly low. A sputtering method, which is dry film formation, is more preferable.

The hole blocking layer 3 is formed also with a view to preventing an electronic contact between the first electrode 2 and the hole transport layer 6. A thickness of the hole blocking layer 3 is not particularly limited but is preferably from 5 nm through 1 μm, more preferably from 500 nm through 700 nm in wet film formation, and more preferably from 10 nm through 30 nm in dry film formation.

<Electron Transport Layer>

The photoelectric conversion element and the solar cell of the present invention include a porous electron transport layer 4 on the hole blocking layer 3. The porous electron transport layer 4 may contain a single layer or multiple layers.

In the case of the multiple layers, it is possible to form multiple layers by coating dispersion liquids of semiconductor particles having different particle diameters, or it is also possible to form multiple layers by coating different kinds of semiconductors or different resin or additive compositions.

When a sufficient thickness is not obtained with one coating, the coating of multiple layers is an effective means.

Typically, an amount of the photosensitizing material supported by the electron transport layer 4 per a unit projected area increases as a thickness of the electron transport layer is increased, leading to an increase in a light capture rate. However, this also increases a distance to which injected electrons diffuse, to increase loss due to recombination of charges.

Hence, the thickness of the electron transport layer 4 is preferably from 100 nm through 100 μm.

The semiconductor is not particularly limited and a known semiconductor may be used.

Specific examples of the semiconductor include element semiconductors such as silicon and germanium, compound semiconductors represented by chalcogenides of metals, and compounds having a perovskite structure.

Examples of the chalcogenides of metals include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium.

Examples of other compound semiconductors include: phosphides of, for example, zinc, gallium, indium, and cadmium; gallium arsenide; copper-indium-selenide; and copper-indium-sulfide.

Examples of the compounds having a perovskite structure include strontium titanate, calcium titanate, sodium titanate, barium titanate, and potassium niobate. One of these semiconductors may be used alone or two or more of these semiconductors may be used as a mixture.

Among these semiconductors, oxide semiconductors are preferable, and titanium oxide, zinc oxide, tin oxide, and niobium oxide are particularly preferable. A crystal form of these semiconductors is not particularly limited and may be monocrystalline, polycrystalline, or amorphous.

A size of the semiconductor particles is not particularly limited. However, an average primary particle diameter is preferably from 1 nm through 100 nm and more preferably from 5 nm through 50 nm.

It is also possible to improve efficiency based on an incident-light-scattering effect obtained by mixing or laminating semiconductor particles having a greater average particle diameter. In this case, an average particle diameter of the semiconductor particles is preferably from 50 nm through 500 nm.

A method for producing the electron transport layer 4 is not particularly limited. Examples of the method include a method for forming a thin film in vacuum, such as sputtering, and a wet film forming method.

When production costs and other factors are taken into consideration, the wet film forming method is preferable, and a method of preparing a paste in which powder or sol of the semiconductor particles is dispersed, and coating an electron collecting electrode substrate with the paste is more preferable.

In using the wet film forming method, a coating method is not particularly limited and may be performed according to a known method. Examples of the coating method include a dipping method, a spraying method, a wire bar method, a spin coating method, a roller coating method, a blade coating method, and a gravure coating method. Further, as a wet printing method, various methods such as letterpress, offset, gravure, intaglio, rubber plate, and screen printing may be used.

In producing a dispersion liquid of the semiconductor particles by mechanical pulverization or using a mill, the dispersion liquid is formed by dispersing at least the semiconductor particles alone or a mixture of the semiconductor particles and a resin in water or an organic solvent.

Examples of the resin include polymers or copolymers of vinyl compounds based on, for example, styrene, vinyl acetate, acrylic ester, and methacrylic ester, silicon resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyallylate resins, polyimide resins, and polyimide resins.

Examples of the solvent in which the semiconductor particles are dispersed include water; alcohol-based solvents such as methanol, ethanol, isopropyl alcohol, and α-terpineol; ketone-based solvents such as acetone, methyl ethyl ketone, and methyl isobutyl ketone; ester-based solvents such as ethyl formate, ethyl acetate, and n-butyl acetate; ether-based solvents such as diethyl ether, dimethoxyethane, tetrahydrofuran, dioxolane, and dioxane; amide-based solvents such as N,N-dimethylformamide, N,N-dimethylacetamide, and N-methyl-2-pyrrolidone; halogenated hydrocarbon-based solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. One of these solvents may be used alone or two or more of these solvents may be used as a mixture solvent.

For prevention of reaggregation of particles, for example, an acid such as hydrochloric acid, nitric acid, and acetic acid, a surfactant such as polyoxyethylene (10) octylphenyl ether, and a chelating agent such as acetylacetone, 2-aminoethanol, and ethylene diamine may be added to the dispersion liquid of the semiconductor particles or to the paste of the semiconductor particles obtained by, for example, a sol-gel method.

Furthermore, adding a thickener with a view to improving a film forming property is an effective means.

Examples of the thickener include polymers such as polyethylene glycols and polyvinyl alcohols and thickeners such as ethyl cellulose.

It is preferable to subject the semiconductor particles after coated to firing, microwave irradiation, electron beam irradiation, or laser light irradiation in order to provide an electronic contact between the particles, improve a film strength, and improve close adhesiveness with the substrate. These treatments may be applied alone or two or more kinds of these treatments may be applied in combination.

In the firing, a firing temperature is not limited to a particular range, but is preferably from 30° C. through 700° C. and more preferably from 100° C. through 600° C. because the resistance of the substrate may rise or the substrate may melt if the temperature is excessively high. A firing time is also not particularly limited, but is preferably from 10 minutes through 10 hours.

The microwave irradiation may be given from a side at which the electron transport layer 4 is formed or from a back side.

An irradiation time is not particularly limited, but is preferably within 1 hour.

After firing, chemical plating using an aqueous solution of titanium tetrachloride or a mixture solution of titanium tetrachloride with an organic solvent or an electrochemical plating treatment using a titanium trichloride aqueous solution may be performed with a view to increasing a surface area of the semiconductor particles and increasing efficiency of electron injection from the photosensitizing material into the semiconductor particles.

A porous state is formed in the film obtained by depositing the semiconductor particles having a diameter of several tens of nanometers by, for example, sintering. This nanoporous structure has an extremely large surface area. The surface area can be expressed by a roughness factor.

The roughness factor is a value representing an actual area inside the porous texture relative to an area of the semiconductor particles coated on the substrate. Hence, a greater roughness factor is more preferable. However, considering the relationship with the film thickness of the electron transport layer 4, the roughness factor is preferably 20 or greater in the present invention.

<Photosensitizing Material>

In the present invention, in order to further improve the conversion efficiency, a photosensitizing material is adsorbed to a surface of the electron transport semiconductor, which is the electron transport layer 4. A substance represented by a general formula (2) is preferable as the photosensitizing material.

General formula (2)

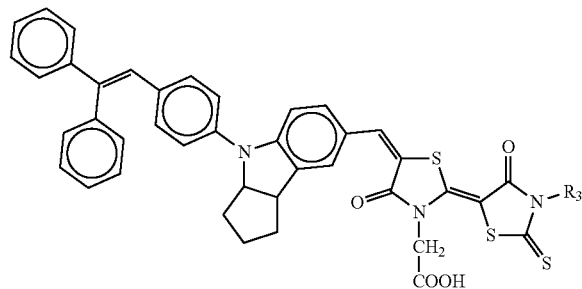

In the formula, $R_3$ represents a substituted or unsubstituted alkyl group.

Specific exemplary compounds of the general formula (2) will be presented below. However, these compounds are non-limiting examples.

| | |
|---|---|
| Dye 1 | $R_3$=CH$_2$CH$_3$ (Japan Chemical Substance Dictionary Nos. J2.477.478C and J3.081.465G) |
| Dye 2 | $R_3$=(CH$_2$)$_3$CH$_3$ |
| Dye 3 | $R_3$=C(CH$_3$)$_3$ |
| Dye 4 | $R_3$=(CH$_2$)$_9$CH$_3$ |
| Dye 5 | $R_3$=(CH$_2$)$_2$COOH |
| Dye 6 | $R_3$=(CH$_2$)$_4$COOH |
| Dye 7 | $R_3$=(CH$_2$)$_7$COOH |
| Dye 8 | $R_3$=(CH$_2$)$_{10}$COOH (Japan Chemical Substance Dictionary No. J3.113.583D) |

A compound represented by the general formula (2) can be synthesized by a method described in Dye and Pigments 91 (2011) pp. 145-152.

The photosensitizing material 5 is not limited to the compounds presented above so long as the photosensitizing material is a compound optically excitable by excitation light used. Specific examples of the photosensitizing material also include the following.

Specific examples of the photosensitizing material include: metal complex compounds described in, e.g., Japanese Translation of PCT International Application Publication No. JP-T-07-500630, Japanese Unexamined Patent Application Publication Nos. 10-233238, 2000-26487, 2000-323191, and 2001-59062; coumarin compounds described in, e.g., Japanese Unexamined Patent Application Publication Nos. 10-93118, 2002-164089 and 2004-95450, and J. Phys. Chem. C, 7224, Vol. 111 (2007); polyene compounds described in, e.g., Japanese Unexamined Patent Application Publication No. 2004-95450 and Chem. Commun., 4887 (2007); indoline compounds described in, e.g., Japanese Unexamined Patent Application Publication Nos. 2003-264010, 2004-63274, 2004-115636, 2004-200068, and 2004-235052, J. Am. Chem. Soc., 12218, Vol. 126 (2004), Chem. Commun., 3036 (2003), and Angew. Chem. Int. Ed., 1923, Vol. 47 (2008); thiophene compounds described in, e.g., J. Am. Chem. Soc., 16701, Vol. 128 (2006) and J. Am. Chem. Soc., 14256, Vol. 128 (2006); cyanine dyes described in, e.g., Japanese Unexamined Patent Application Publication Nos. 11-86916, 11-214730, 2000-106224, 2001-76773, and 2003-7359; merocyanine dyes described in, e.g., Japanese Unexamined Patent Application Publication Nos. 11-214731, 11-238905, 2001-52766, 2001-76775, and 2003-7360; 9-arylxanthene compounds described in, e.g., Japanese Unexamined Patent Application Publication Nos. 10-92477, 11-273754, 11-273755, and 2003-31273; triarylmethane compounds described in, e.g., Japanese Unexamined Patent Application Publication Nos. 10-93118 and 2003-31273; and phthalocyanine compounds and porphyrin compounds described in, e.g., Japanese Unexamined Patent Application Publication Nos. 09-199744, 10-233238, 11-204821 and 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008).

Among these photosensitizing materials, the metal complex compounds, the coumarin compounds, the polyene compounds, the indoline compounds, and the thiophene compounds are preferable.

As a method for adsorbing the photosensitizing material 5 to the electron transport layer 4, it is possible to use a method of immersing the electron collecting electrode containing the semiconductor particles in a photosensitizing material solution or dispersion liquid and a method of coating the electron transport layer with the solution or the dispersion liquid to adsorb the photosensitizing material.

As the method of immersing the electron collecting electrode containing the semiconductor particles in the photosensitizing material solution or dispersion liquid, for example, an immersing method, a dipping method, a roller method, and an air knife method may be used.

As the method of coating the electron transport layer with the solution or the dispersion liquid to adsorb the photosensitizing material, for example, a wire bar method, a slide hopper method, an extrusion method, a curtain method, a spinning method, and a spraying method may be used.

The photosensitizing material may be adsorbed under a supercritical fluid using, for example, carbon dioxide.

In adsorbing the photosensitizing material 5, a condensing agent may be used in combination.

The condensing agent may be any of: a substance that is assumed to catalyze physical or chemical binding of the photosensitizing material and the electron transport compound with a surface of an inorganic substance; and a substance that acts stoichiometrically to cause a chemical equilibrium to move in an advantageous manner.

Furthermore, thiol or a hydroxy compound may be added as the condensing aid.

Examples of a solvent in which the photosensitizing material 5 is dissolved or dispersed include: water; alcohol-based solvents such as methanol, ethanol, and isopropyl alcohol; ketone-based solvents such as acetone, methyl ethyl ketone, and methyl isobutyl ketone; ester-based solvents such as ethyl formate, ethyl acetate, and n-butyl acetate; ether-based solvents such as diethyl ether, dimethoxyethane, tetrahydrofuran, dioxolane, and dioxane; amide-based solvents such as N,N-dimethylformamide, N,N-dimethylacetamide, and N-methyl-2-pyrrolidone; halogenated hydrocarbon-based solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. One of these solvents may be used alone or two or more of these solvents may be used as a mixture.

Some kinds of the photosensitizing materials act more effectively when aggregation between different compounds is suppressed. Hence, a deaggregating agent may be used in combination.

As the deaggregating agent, steroid compounds such as cholic acid and chenodeoxycholic acid, long-chain alkylcarboxylic acids, or long-chain alkylphosphonic acids are preferable. An appropriate deaggregating agent is selected depending on the dye used.

An amount of the deaggregating agent added is preferably from 0.01 parts by mass through 500 parts by mass and more preferably from 0.1 parts by mass through 100 parts by mass relative to 1 part by mass of the dye.

A temperature in adsorbing the photosensitizing material alone or a temperature in adsorbing the photosensitizing material together with the deaggregating agent is preferably −50° C. or higher but 200° C. or lower.

The adsorption may be performed in a still state or under stirring.

A method for the stirring is not particularly limited and may be appropriately selected depending on the intended purpose. Examples of the method include a stirrer, a ball mill, a paint conditioner, a sand mill, an attritor, a disperser, and ultrasonic dispersion.

A time needed for the adsorption is preferably 5 seconds or longer but 1,000 hours or shorter, more preferably 10 seconds or longer but 500 hours or shorter, and yet more preferably 1 minute or longer but 150 hours or shorter.

Furthermore, it is preferable to perform the adsorption in a dark place.

<Hole Transport Layer>

The hole transport material 6 is not particularly limited and may be appropriately selected depending on the intended purpose so long as the hole transport material contains an organic hole transport material and at least one of basic compounds represented by a general formula (1a) and a general formula (1b).

As a typical hole transport layer, for example, an electrolytic solution obtained by dissolving a redox couple in an organic solvent, a gel electrolyte obtained by immersing in a polymer matrix, a liquid obtained by dissolving a redox couple in an organic solvent, a molten salt containing a redox couple, a solid electrolyte, an inorganic hole transport material, and an organic hole transport material are used.

<<Organic Hole Transport Material>>

The organic hole transport material can be used in both of a hole transport layer 6 having a single-layer structure formed of a single material and a hole transport layer 6 having a laminated structure formed of a plurality of compounds.

A known organic hole transport compound is used as the organic hole transport material used in the single-layer structure formed of a single material.

Specific examples of the known organic hole transport compound include: oxadiazole compounds presented in, e.g., Japanese Examined Patent Publication No. 34-5466; triphenylmethane compounds presented in, e.g., Japanese Examined Patent Publication No. 45-555; pyrazoline compounds presented in, e.g., Japanese Examined Patent Publication No. 52-4188; hydrazone compounds presented in, e.g., Japanese Examined Patent Publication No. 55-42380; oxadiazole compounds presented in, e.g., Japanese Unexamined Patent Application Publication No. 56-123544; tetraarylbenzidine compounds presented in Japanese Unexamined Patent Application Publication No. 54-58445; stilbene compounds presented in Japanese Unexamined Patent Application Publication No. 58-65440 or Japanese Unexamined Patent Application Publication No. 60-98437; and spirobifluorene-based compounds such as spiro-OMeTAD described in Adv, Mater., 813, vol. 17, (2005), Among these organic hole transport compounds, the hole transport material called spiro-OMeTAD mentioned above is preferable because this hole transport material exhibits an excellent photoelectric conversion characteristic.

A known hole transportable polymer material is used as the polymer material to be used near the second electrode 7 in the hole transport layer 6 used in the form of the laminated structure.

Specific examples of the known hole transportable polymer material include:

polythiophene compounds such as poly(3-n-hexylthiophene), poly(3-n-octyloxythiophene), poly(9,9'-dioctylfluorene-co-bithiophene), poly(3,3'''-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene);

polyphenylenevinylene compounds such as poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylphexyloxy)-1,4-phenylenevinylene)-co-(4,4'-biphenylene-vinylene)];

polyfluorene compounds such as poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)];

polyphenylene compounds such as poly[2,5-dioctyloxy-1,4-phenylene] and poly[2,5-di(2-ethylhexyloxy-1,4-phenylene];

polyarylamine compounds such as poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene]; and polythiadiazole compounds such as poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole).

Among these hole transportable polymer materials, the polythiophene compounds and the polyarylamine compounds are particularly preferable, considering carrier mobility and ionization potential.

Various additives may be added in the organic hole transport material.

Examples of the additives include: iodine; metal iodides such as lithium iodide, sodium iodide, potassium iodide, cesium iodide, calcium iodide, copper iodide, iron iodide, and silver iodide; quaternary ammonium salts such as tetraalkylammonium iodide and pyridinium iodide; metal bromides such as lithium bromide, sodium bromide, potassium bromide, cesium bromide, and calcium bromide; bromine salts of quaternary ammonium compounds, such as tetraalkylammonium bromide and pyridinium bromide; metal chlorides such as copper chloride and silver chloride; metal acetates such as copper acetate, silver acetate, and palladium acetate; metal sulfates such as copper sulfate and zinc sulfate; metal complexes such as ferrocyanate-ferricyanate and ferrocene-ferricinium ion; sulfur compounds such as polysodium sulfide and alkylthiol-alkyldisulfide; viologen dyes, hydroquinone, etc.; ionic liquids described in Inorg. Chem. 35 (1996) 1168, such as 1,2-dimethyl-3-n-propylimidazolinium iodide, 1-methyl-3-n-hexylimidazolinium iodide, 1,2-dimethyl-3-ethylimidazoliumtrifluoromethane sulfonic acid salt, 1-methyl-3-butylimidazoliumnonafluorobutyl sulfonic acid salt, and 1-methyl-3-ethylimidazoliumbis(trifluoromethyl)sulfonylimide; basic compounds such as pyridine, 4-t-butylpyridine, and benzimidazole; and lithium compounds such as lithium trifluoromethane sulfonylimide and lithium diisopropylimide.

<<Basic Compounds>>

In the present invention, by addition of a basic compound represented by a general formula (1a) or a general formula (1b) below in the organic hole transport material, a particularly high open circuit voltage can be obtained.

Furthermore, an internal resistance in the photoelectric conversion element rises to enable reduction of loss current under weak light such as room light. Hence, it is possible to obtain an open circuit voltage higher than obtained with an existing basic compound.

General formula (1a)

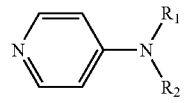

General formula (1b)

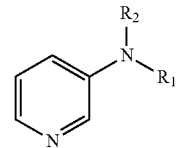

In the formula (1a) or (1b), $R_1$ and $R_2$ represent a substituted or unsubstituted alkyl group or aromatic hydrocarbon group and may be identical or different, and $R_1$ and $R_2$ may bind with each other to form a substituted or unsubstituted heterocyclic group containing a nitrogen atom. Examples of the substituent include alkyl groups, aromatic hydrocarbon groups, and substituted or unsubstituted alkoxy groups.

Hitherto, there have been known compounds that have a similar structure to the general formula (1a) or the general formula (1b) and are classified into the basic compounds presented below. Some of these compounds are known to have been used as basic compounds in iodine electrolytic solution-type dye-sensitized solar cells. These compounds provide a high open circuit voltage, but have been reported to significantly reduce a short-circuiting current density and considerably worsen a photoelectric conversion characteristic.

The hole transport layer 6 uses the organic hole transport material described above and is different from a hole transport model based on, for example, the iodine electrolytic solution.

Hence, reduction of a short-circuiting current density is low and a high open circuit voltage can be obtained, to make it possible to obtain an excellent photoelectric conversion characteristic. Furthermore, it could be verified that a particularly outstanding excellent performance was exhibited in photoelectric conversion under weak light such as room light. This photoelectric conversion is a scarcely reported case.

Specific exemplary compounds of the general formula (1a) or the general formula (1b) are presented in Table 1 (Table 1-1 and Table 1-2) below. However, these compounds are non-limiting examples.

TABLE 1-continued
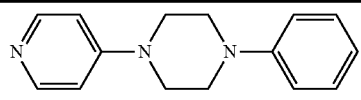
J50,535D
Compound No. 15
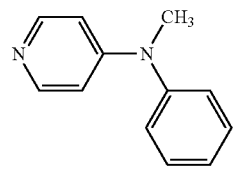
J580,459I
Compound No. 16
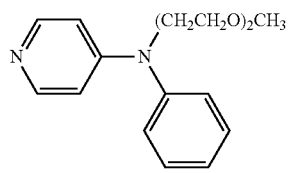
Compound No. 17
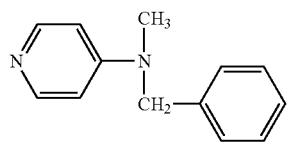
J1.983,963J
Compound No. 18
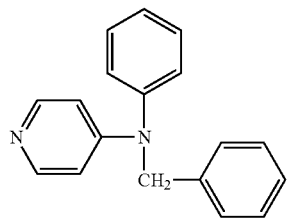 [SMILES: c1ccc(CN(c2ccccc2)c2ccncc2)cc1]
Compound No. 19
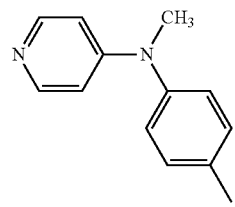
Compound No. 20
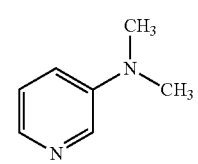
Compound No. 21
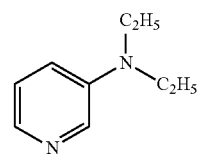
Compound No. 22
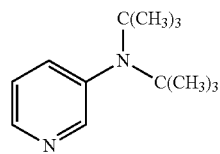 [SMILES: CC(C)(C)N(c1cccnc1)C(C)(C)C]
Compound No. 23
TABLE 1-continued
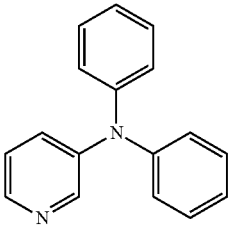 [SMILES: c1ccc(N(c2ccccc2)c2cccnc2)cc1]
Compound No. 24
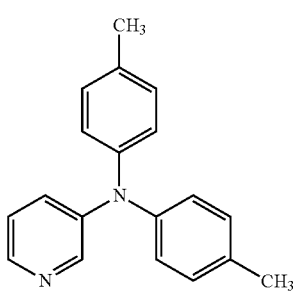 [SMILES: Cc1ccc(N(c2ccc(C)cc2)c2cccnc2)cc1]
Compound No. 25
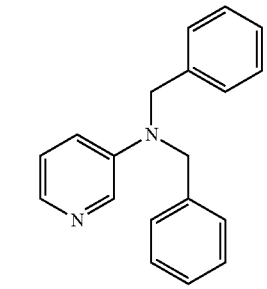 [SMILES: c1ccc(CN(Cc2ccccc2)c2cccnc2)cc1]
Compound No. 26
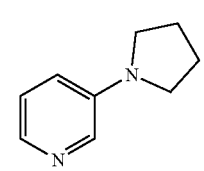 [SMILES: c1cncc(N2CCCC2)c1]
Compound No. 27
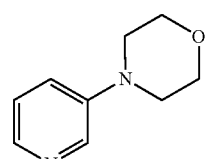
Compound No. 28
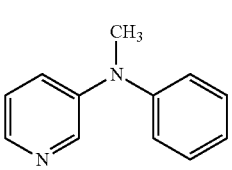
Compound No. 29
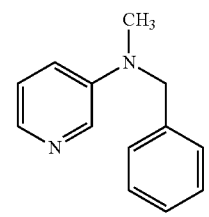
Compound No. 30

TABLE 1-continued

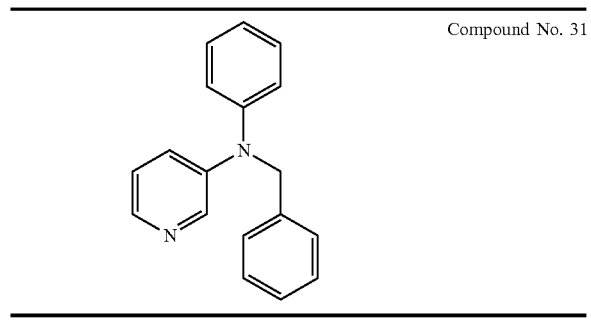

Compound No. 31

An amount of the basic compound represented by the general formula (1a) or the general formula (1b) added in the hole transport layer 6 is preferably 1 part by mass or greater but 20 parts by mass or less and more preferably 5 parts by mass or greater but 15 parts by mass or less relative to 100 parts by mass of the organic hole transport material.

<Method for Synthesizing the Basic Material (1a) or (1b) Used in the Present Invention>

The basic material can be easily synthesized through the route presented below, in the same manner as in a reported case (J. Org. Chem., 67 (2002) 3029).

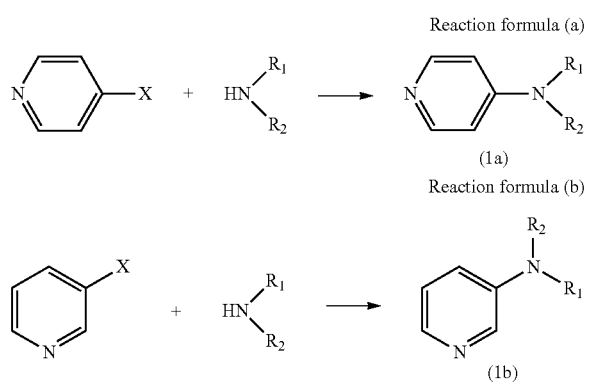

In the formulae (a) and (b), $R_1$ and $R_2$ represent a substituted or unsubstituted alkyl group or aromatic hydrocarbon group and may be identical or different. $R_1$ and $R_2$ may bind with each other to form a substituted or unsubstituted heterocyclic group containing a nitrogen atom. X represents a halogen.

With a view to improving conductivity, an oxidizing agent for changing part of the organic hole transport material to a radical cation may be added.

Examples of the oxidizing agent include tris(4-bromophenyl)aminium hexachloroantimonate, silver hexafluoroantimonate, nitrosonium tetrafluoroborate, silver nitrate, and cobalt complex-based compounds.

There is no need that the whole of the organic hole transport material be oxidized by addition of the oxidizing agent. Only part of the organic hole transport material needs to be oxidized. It is optional whether the added oxidizing agent is removed or not to the outside of the system after addition.

The hole transport layer 6 is formed directly on the electron transport layer 4 supporting the photosensitizing material. A method for producing the hole transport layer 6 is not particularly limited. Examples of the method include a method for forming a thin film in vacuum, such as vacuum vapor deposition, and a wet film forming method. Considering production costs and other factors, the wet film forming method is particularly preferable, and a method for coating the electron transport layer 4 with the hole transport layer is preferable.

In using the wet film forming method, a coating method is not particularly limited and may be performed according to a known method. Examples of the coating method include a dipping method, a spraying method, a wire bar method, a spin coating method, a roller coating method, a blade coating method, and a gravure coating method. Further, as a wet printing method, various methods such as letterpress, offset, gravure, intaglio, rubber plate, and screen printing may be used.

Film formation may be performed under a supercritical fluid or a subcritical fluid having a temperature/pressure lower than a critical point.

The supercritical fluid is not particularly limited and may be appropriately selected depending on the intended purpose so long as the supercritical fluid exists as a non-condensable high-density fluid in temperature and pressure ranges higher than a limit (critical point) until which a gas and a liquid can coexist, and even when compressed, does not condense but is maintained at higher than or equal to a critical temperature and higher than or equal to a critical pressure. However, a supercritical fluid having a low critical temperature is preferable.

Preferable examples of the supercritical fluid include carbon monoxide, carbon dioxide, ammonia, nitrogen, water, alcohol-based solvents such as methanol, ethanol, and n-butanol, hydrocarbon-based solvents such as ethane, propane, 2,3-dimethylbutane, benzene, and toluene, halogen-based solvents such as methylene chloride and chlorotrifluoromethane, and ether-based solvents such as dimethyl ether. Among these supercritical fluids, the carbon dioxide is particularly preferable because the carbon dioxide has a critical pressure of 7.3 MPa and a critical temperature of 31° C., and hence can form a supercritical state easily and is incombustible and easy to handle.

One of these fluids may be used alone or two or more of these fluids may be used as a mixture.

The subcritical fluid is not particularly limited and may be appropriately selected depending on the intended purpose so long as the subcritical fluid exists as a high-pressure liquid in temperature and pressure ranges near critical points.

The compounds raised as examples of the supercritical fluid can also be used favorably as the subcritical fluid.

A critical temperature and a critical pressure of the supercritical fluid are not particularly limited and may be appropriately selected depending on the intended purpose. However, the critical temperature is preferably −273° C. or higher but 300° C. or lower and particularly preferably 0° C. or higher but 200° C. or lower.

In addition to the supercritical fluid and the subcritical fluid, an organic solvent and an entrainer may further be used in combination.

Addition of the organic solvent and the entrainer makes it easier to adjust solubility to the supercritical fluid.

The organic solvent is not particularly limited and may be appropriately selected depending on the intended purpose. Examples of the organic solvent include: ketone-based solvents such as acetone, methyl ethyl ketone, and methyl isobutyl ketone; ester-based solvents such as ethyl formate, ethyl acetate, and n-butyl acetate; ether-based solvents such as diisopropyl ether, dimethoxyethane, tetrahydrofuran, dioxolane, and dioxane; amide-based solvents such as N,N-dimethylformamide, N,N-dimethylacetamide, and N-methyl-2-pyrrolidone; halogenated hydrocarbon-based solvents dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

A press process step may be provided after the organic hole transport material is provided on the first electrode 2 provided with the electron transport material coated with the photosensitizing material.

It is considered that the press process makes close adhesion of the organic hole transport material with the porous electrode stronger to improve efficiency.

A method for the press process is not particularly limited. Examples of the method include a press forming method using a flat plate represented by an IR tablet molding machine, and a roll press method using, for example, a roller.

A pressure in the press process is preferably 10 $kgf/cm^2$ or higher and more preferably 30 $kgf/cm^2$ or higher. A time for which the press process is performed is not particularly limited but is preferably within 1 hour.

Heat may be applied during the press process.

In the press process, a release material may be interposed between a press machine and the electrode.

Examples of the release material include fluororesins such as polytetrafluoroethylene, polychlorotrifluoroethylene, tetrafluoroethylene-hexafluoropropylene copolymers, perfluoroalkoxy fluoride resins, polyvinylidene fluoride, ethylene-tetrafluoroethylene copolymers, ethylene-chlorotrifluoroethylene copolymers, and polyvinyl fluoride.

After the press process step, a metal oxide may be provided between the organic hole transport material and the second electrode 7, before the counter electrode is provided. Examples of the metal oxide include molybdenum oxide, tungsten oxide, vanadium oxide, and nickel oxide. Among these metal oxides, the molybdenum oxide is particularly preferable.

As described above, the hole transport layer 6 may have a single-layer structure formed of a single material or a laminated structure formed of a plurality of compounds. In the case of the laminated structure, it is preferable to use a polymer material in the organic hole transport material layer near the second electrode 7.

This is because use of the polymer material having an excellent film forming property can make the surface of the porous electron transport layer 4 smoother and can improve the photoelectric conversion characteristic.

Furthermore, it is difficult for the polymer material to permeate the inside of the porous electron transport layer 4. This conversely makes the polymer material excellent in coating the surface of the porous electron transport layer 4 and effective for preventing short circuiting when an electrode is provided, leading to a higher performance.

<Second Electrode>

A method for providing the metal oxide on the organic hole transport material is not particularly limited. Examples of the method include a method for forming a thin film in vacuum, such as sputtering and vacuum vapor deposition, and a wet film forming method.

As the wet film forming method, preferable is a method of preparing a paste obtained by dispersing powder or sol of the metal oxide, and coating the hole transport layer 6 with the paste.

In using the wet film forming method, a coating method is not particularly limited and may be performed according to a known method. Examples of the coating method include a dipping method, a spraying method, a wire bar method, a spin coating method, a roller coating method, a blade coating method, and a gravure coating method. Further, as a wet printing method, various methods such as letterpress, offset, gravure, intaglio, rubber plate, and screen printing may be used. A thickness of the second electrode is preferably from 0.1 nm through 50 nm and more preferably from 1 nm through 10 nm.

The second electrode 7 is newly provided after the hole transport layer 6 is formed or newly provided on the metal oxide.

Typically, the same configuration as the first electrode 2 described above can be used as the second electrode 7. A support is not indispensable for a configuration of which strength and seal can be sufficiently maintained.

Examples of the material of the second electrode 7 include: metals such as platinum, gold, silver, copper, and aluminium; carbon-based compounds such as graphite, fullerene, carbon nanotube, and graphene; conductive metal oxides such as ITO, FTO, and ATO; and conductive polymers such as polythiophene and polyaniline.

The thickness of the second electrode 7 is not particularly limited. Hence, the materials for the second electrode 7 may be used alone, or two or more of the materials may be used as a mixture.

Formation of the second electrode 7 by coating can be performed by appropriate methods such as coating, lamination, vapor deposition, CVD, and pasting on the hole transport layer 6, depending on the kind of the material used and the kind of the hole transport layer C.

In order to enable operation as a dye-sensitized solar cell, at least one of the first electrode 2 and the second electrode 7 needs to be substantially transparent.

In the dye-sensitized solar cell of the present invention, the first electrode 2 is transparent. A preferable manner is that sunlight is made incident from the first electrode 2 side. In this case, it is preferable to use a light-reflecting material at the second electrode 7 side. Metals, glass on which a conductive oxide is vapor-deposited, plastics, and metallic thin films are preferable.

Further, providing an antireflection layer at a sunlight incident side is an effective means.

<Applications>

The dye-sensitized solar cell of the present invention can be applied to power supply devices using a solar cell.

Application examples include all devices that hitherto have utilized a solar cell or a power supply device using a solar cell.

Needless to say, the dye-sensitized solar cell may be used as, for example, a solar cell for a desk-top electronic calculator or a wristwatch. However, a power supply device to be mounted on, for example, a portable phone, an electronic organizer, and an electronic paper can be raised as examples that take advantage of the characteristic of the photoelectric conversion element of the present invention. Furthermore, an auxiliary power supply intended for extending a continuously usable time of rechargeable or dry cell-operated electric appliances can be raised as an application example.

EXAMPLES

The present invention will be specifically described below by way of Examples. However, embodiments of the present invention should not be construed as being limited to the Examples.

Example 1

(Production of Titanium Oxide Semiconductor Electrode)

Titanium tetra-n-propoxide (2 ml), acetic acid (4 ml), ion-exchanged water (1 ml), and 2-propanol (40 ml) were mixed, spin-coated on a FTO glass substrate, dried at room temperature, and fired in air at 450° C. for 30 minutes, to produce a titanium oxide semiconductor electrode.

The same solution was again spin-coated on the obtained electrode to a film thickness of 100 nm and fired in air at 450° C. for 30 minutes, to form a hole blocking layer.

Titanium oxide (available from Nippon Aerosil Co., Ltd., P90) (3 g), acetylacetone (0.2 g), and a surfactant (available from Wako Pure Chemical Industries, Ltd., polyoxyethylene octylphenyl ether: TRITON X-100) (0.3 g) were subjected to a bead mill treatment for 12 hours together with water (5.5 g) and ethanol (1.0 g).

Polyethylene glycol (#20,000) (1.2 g) was added to the obtained dispersion liquid, to produce a paste.

The paste was coated on the hole blocking layer to a thickness of 1.5 μm, dried at room temperature, and fired in air at 500° C. for 30 minutes, to form a porous electron transport layer.

(Production of Dye-Sensitized Solar Cell)

The titanium oxide semiconductor electrode described above was immersed in a sensitizing dye, which was the Dye 8 mentioned above (0.5 mM, an acetonitrile/t-butanol (volume ratio of 1:1) solution), and left to stand still in a dark place for 1 hour, to adsorb the photosensitizing material.

The semiconductor electrode supporting the photosensitizing agent was spin-coated with a solution obtained by adding lithium bis(trifluoromethanesulfonyl)imide (with a solid content of 1% by mass) available from Kanto Chemical Co., Inc. and the exemplary basic compound No. 1 (with a solid content of 1.4% by mass) to a solution of an organic hole transport material (available from Merck Ltd., product name: 2,2',7,7'-tetrakis(N,N-di-p-methoxyphenylamino)-9, 9'-spirobifluorene, product number: SHT-263) dissolved in chlorobenzene (with a solid content of 14% by mass), to form a hole transport layer. Silver was vacuum-vapor deposited on the hole transport layer to a thickness of 100 nm, to produce a dye-sensitized solar cell.

(Evaluation of Dye-Sensitized Solar Cell)

A photoelectric conversion efficiency of the obtained dye-sensitized solar cell under white LED irradiation (0.05 mW/cm$^2$) was measured. The measurement was performed using a desk lamp CDS-90α (study mode) available from Cosmotechno. Co., Ltd. as the white LED, and a solar cell evaluation system, AS-510-PV03 available from NF Corporation as an evaluator. As a result, excellent characteristics were exhibited, including an open circuit voltage of 0.82 V, a short-circuiting current density of 8.20 μA/cm$^2$, a form factor of 0.78, and a conversion efficiency of 10.48%.

Example 2

A photoelectric conversion element was produced in the same manner as in Example 1, except that the basic compound of Example 1 was changed to the basic compound represented by the exemplary compound No. 3, and was evaluated. The results are presented in Table 2 and Table 3.

Example 3

A photoelectric conversion element was produced in the same manner as in Example 1, except that the basic compound of Example 1 was changed to the basic compound represented by the exemplary compound No. 5, and was evaluated. The results are presented in Table 2 and Table 3.

Example 4

A photoelectric conversion element was produced in the same manner as in Example 1, except that the basic compound of Example 1 was changed to the basic compound represented by the exemplary compound No. 8, and was evaluated. The results are presented in Table 2 and Table 3.

Example 5

A photoelectric conversion element was produced in the same manner as in Example 1, except that the basic compound of Example 1 was changed to the basic compound represented by the exemplary compound No. 10, and was evaluated. The results are presented in Table 2 and Table 3.

Example 6

A photoelectric conversion element was produced in the same manner as in Example 1, except that the basic compound of Example 1 was changed to the basic compound represented by the exemplary compound No. 12, and was evaluated. The results are presented in Table 2 and Table 3.

Example 7

A photoelectric conversion element was produced in the same manner as in Example 1, except that the dye of Example 1 was changed to a dye, Dye 1, and the basic compound of Example 1 was changed to the basic compound represented by the exemplary compound No. 13, and was evaluated. The results are presented in Table 2 and Table 3.

Example 8

A photoelectric conversion element was produced in the same manner as in Example 1, except that the dye of Example 1 was changed to a dye, Dye 1, and the basic compound of Example 1 was changed to the basic compound represented by the exemplary compound No. 15, and was evaluated. The results are presented in Table 2 and Table 3.

Example 9

A photoelectric conversion element was produced in the same manner as in Example 1, except that the dye of Example 1 was changed to a dye, Dye 1, and the basic compound of Example 1 was changed to the basic compound represented by the exemplary compound No. 16, and was evaluated. The results are presented in Table 2 and Table 3.

Example 10

A photoelectric conversion element was produced in the same manner as in Example 1, except that the dye of Example 1 was changed to a dye, Dye 4, and the basic compound of Example 1 was changed to the basic compound represented by the exemplary compound No. 18, and was evaluated. The results are presented in Table 2 and Table 3.

Example 11

A photoelectric conversion element was produced in the same manner as in Example 1, except that the dye of Example 1 was changed to a dye, Dye 4, and the basic compound of Example 1 was changed to the basic compound represented by the exemplary compound No. 20, and was evaluated. The results are presented in Table 2 and Table 3.

Example 12

A photoelectric conversion element was produced in the same manner as in Example 1, except that the dye of Example 1 was changed to a dye, Dye 4, and the basic compound of Example 1 was changed to the basic compound represented by the exemplary compound No. 13, and was evaluated. The results are presented in Table 2 and Table 3.

Example 13

A photoelectric conversion element was produced in the same manner as in Example 1, except that the dye of Example 1 was changed to a dye, Dye 8, and the basic compound of Example 1 was changed to the basic compound represented by the exemplary compound No. 13, and was evaluated. The results are presented in Table 2 and Table 3.

Example 14

A dye-sensitized solar cell was produced in the same manner as in Example 1, except that lithium bis(trifluoromethanesulfonyl)imide of Example 1 was changed to 1-n-hexyl-3-methylimidazolinium bis(trifluoromethylsulfonyl)imide, and was evaluated. The results are presented in Table 2 and Table 3.

Example 15

A dye-sensitized solar cell was produced in the same manner as in Example 1, except that a hole transport layer described below was inserted between the hole transport layer and silver electrode of Example 1, and was evaluated. The results are presented in Table 2 and Table 3.

The hole transport layer was spray-coated with a solution obtained by adding 1-n-hexyl-3-methylimidazolinium trifluorosulfonyldiimide (27 mM) to chlorobenzene in which poly(3-n-hexylthiophene) available from Sigma-Aldrich Corporation had been dissolved (with a solid content of 2% by mass), to form a film of about 100 nm.

Example 16

A photoelectric conversion element was produced in the same manner as in Example 1, except that the dye of Example 1 was changed to a dye, Dye 8, and the basic compound of Example 1 was changed to the basic compound represented by the exemplary compound No. 21, and was evaluated. The results are presented in Table 2 and Table 3.

Example 17

A photoelectric conversion element was produced in the same manner as in Example 1, except that the basic compound of Example 1 was changed to the basic compound represented by the exemplary compound No. 23, and was evaluated. The results are presented in Table 2 and Table 3.

Example 18

A photoelectric conversion element was produced in the same manner as in Example 1, except that the basic compound of Example 1 was changed to the basic compound represented by the exemplary compound No. 24, and was evaluated. The results are presented in Table 2 and Table 3.

Example 19

A photoelectric conversion element was produced in the same manner as in Example 1, except that the basic compound of Example 1 was changed to the basic compound represented by the exemplary compound No. 26, and was evaluated. The results are presented in Table 2 and Table 3.

Example 20

A photoelectric conversion element was produced in the same manner as in Example 1, except that the basic compound of Example 1 was changed to the basic compound represented by the exemplary compound No. 28, and was evaluated. The results are presented in Table 2 and Table 3.

Example 21

A photoelectric conversion element was produced in the same manner as in Example 1, except that the basic compound of Example 1 was changed to the basic compound represented by the exemplary compound No. 29, and was evaluated. The results are presented in Table 2 and Table 3.

Example 22

A photoelectric conversion element was produced in the same manner as in Example 1, except that the dye of Example 1 was changed to a dye, Dye 1, and the basic compound of Example 1 was changed to the basic compound represented by the exemplary compound No. 26, and was evaluated. The results are presented in Table 2 and Table 3.

Example 23

A photoelectric conversion element was produced in the same manner as in Example 1, except that the dye of Example 1 was changed to a dye, Dye 1, and the basic compound of Example 1 was changed to the basic compound represented by the exemplary compound No. 30, and was evaluated. The results are presented in Table 2 and Table 3.

Example 24

A photoelectric conversion element was produced in the same manner as in Example 1, except that the dye of Example 1 was changed to a dye, Dye 1, and the basic compound of Example 1 was changed to the basic compound represented by the exemplary compound No. 31, and was evaluated. The results are presented in Table 2 and Table 3.

Example 25

A photoelectric conversion element was produced in the same manner as in Example 1, except that the dye of Example 1 was changed to a dye, Dye 4, and the basic compound of Example 1 was changed to the basic compound represented by the exemplary compound No. 21, and was evaluated. The results are presented in Table 2 and Table 3.

Example 26

A photoelectric conversion element was produced in the same manner as in Example 1, except that the dye of Example 1 was changed to a dye, Dye 4, and the basic compound of Example 1 was changed to the basic compound represented by the exemplary compound No. 26, and was evaluated. The results are presented in Table 2 and Table 3.

Example 27

A photoelectric conversion element was produced in the same manner as in Example 1, except that the dye of Example 1 was changed to a dye, Dye 4, and the basic compound of Example 1 was changed to the basic compound represented by the exemplary compound No. 28, and was evaluated. The results are presented in Table 2 and Table 3.

Example 28

A dye-sensitized solar cell was produced in the same manner as in Example 1, except that lithium bis(trifluoromethanesulfonyl)imide of Example 1 was changed to 1-n-hexyl-3-methylimidazolinium bis(trifluoromethylsulfonyl)imide, and was evaluated. The results are presented in Table 2 and Table 3.

Example 29

A dye-sensitized solar cell was produced in the same manner as in Example 16, except that a hole transport layer described below was inserted between the hole transport layer and silver electrode of Example 16, and was evaluated. The results are presented in Table 2 and Table 3.

The hole transport layer was spray-coated with a solution obtained by adding 1-n-hexyl-3-methylimidazolinium trifluorosulfonyldiimide (27 mM) to chlorobenzene in which poly(3-n-hexylthiophene) available from Sigma-Aldrich Corporation was dissolved (with a solid content of 2% by mass), to form a film of about 100 nm.

Comparative Example 1

A photoelectric conversion element was produced in the same manner as in Example 1, except that the basic compound of Example 1 was changed to tertial butylpyridine available from Sigma-Aldrich Corporation, and was evaluated. The results are presented in Table 2 and Table 3.

TABLE 2

| | | | Materials added to solution in which organic hole transport material was dissolved | |
|---|---|---|---|---|
| Example No. | Dye | Basic compound | Electrolyte | Remarks |
| 1 | 8 | No. 1 | Lithium bis(trifluoromethanesulfonyl)imide | |
| 2 | 8 | No. 3 | Lithium bis(trifluoromethanesulfonyl)imide | |
| 3 | 8 | No. 5 | Lithium bis(trifluoromethanesulfonyl)imide | |
| 4 | 8 | No. 8 | Lithium bis(trifluoromethanesulfonyl)imide | |
| 5 | 8 | No. 10 | Lithium bis(trifluoromethanesulfonyl)imide | |
| 6 | 8 | No. 12 | Lithium bis(trifluoromethanesulfonyl)imide | |
| 7 | 1 | No. 13 | Lithium bis(trifluoromethanesulfonyl)imide | |
| 8 | 1 | No. 15 | Lithium bis(trifluoromethanesulfonyl)imide | |
| 9 | 1 | No. 16 | Lithium bis(trifluoromethanesulfonyl)imide | |
| 10 | 4 | No. 18 | Lithium bis(trifluoromethanesulfonyl)imide | |
| 11 | 4 | No. 20 | Lithium bis(trifluoromethanesulfonyl)imide | |
| 12 | 4 | No. 13 | Lithium bis(trifluoromethanesulfonyl)imide | |
| 13 | 8 | No. 13 | Lithium bis(trifluoromethanesulfonyl)imide | |
| 14 | 8 | No. 1 | 1-n-hexyl-3-methylimidazolinium bis(trifluoromethylsulfonyl)imide | |
| 15 | 8 | No. 1 | Lithium bis(trifluoromethanesulfonyl)imide | Another hole transport layer was inserted between hole transport layer and silver electrode |
| 16 | 8 | No. 21 | Lithium bis(trifluoromethanesulfonyl)imide | |
| 17 | 8 | No. 23 | Lithium bis(trifluoromethanesulfonyl)imide | |
| 18 | 8 | No. 24 | Lithium bis(trifluoromethanesulfonyl)imide | |
| 19 | 8 | No. 26 | Lithium bis(trifluoromethanesulfonyl)imide | |
| 20 | 8 | No. 28 | Lithium bis(trifluoromethanesulfonyl)imide | |
| 21 | 8 | No. 29 | Lithium bis(trifluoromethanesulfonyl)imide | |
| 22 | 1 | No. 26 | Lithium bis(trifluoromethanesulfonyl)imide | |
| 23 | 1 | No. 30 | Lithium bis(trifluoromethanesulfonyl)imide | |
| 24 | 1 | No. 31 | Lithium bis(trifluoromethanesulfonyl)imide | |
| 25 | 4 | No. 21 | Lithium bis(trifluoromethanesulfonyl)imide | |
| 26 | 4 | No. 26 | Lithium bis(trifluoromethanesulfonyl)imide | |

TABLE 2-continued

Materials added to solution in which organic hole transport material was dissolved

| Example No. | Dye | Basic compound | Electrolyte | Remarks |
|---|---|---|---|---|
| 27 | 4 | No. 28 | Lithium bis(trifluoromethanesulfonyl)imide | |
| 28 | 8 | No. 21 | 1-n-hexyl-3-methylimidazolinium bis(trifluoromethylsulfonyl)imide | |
| 29 | 8 | No. 21 | Lithium bis(trifluoromethanesulfonyl)imide | Another hole transport layer was inserted between hole transport layer and silver electrode |
| Comparative Example 1 | 8 | Tertial butyl pyridine | Lithium bis(trifluoromethanesulfonyl)imide | |

TABLE 3

| Example No. | Open circuit voltage (V) | Short-circuiting current density ($\mu A/cm^2$) | Form factor | Conversion efficiency (%) |
|---|---|---|---|---|
| 1 | 0.82 | 8.20 | 0.78 | 10.48 |
| 2 | 0.83 | 7.95 | 0.76 | 10.02 |
| 3 | 0.83 | 8.04 | 0.75 | 10.00 |
| 4 | 0.81 | 8.32 | 0.76 | 10.24 |
| 5 | 0.75 | 8.52 | 0.79 | 10.09 |
| 6 | 0.81 | 8.45 | 0.78 | 10.67 |
| 7 | 0.85 | 8.28 | 0.78 | 10.97 |
| 8 | 0.87 | 7.85 | 0.76 | 10.38 |
| 9 | 0.80 | 8.25 | 0.79 | 10.42 |
| 10 | 0.82 | 8.25 | 0.78 | 10.55 |
| 11 | 0.78 | 8.31 | 0.79 | 10.24 |
| 12 | 0.84 | 8.25 | 0.77 | 10.67 |
| 13 | 0.86 | 8.35 | 0.79 | 11.34 |
| 14 | 0.79 | 8.53 | 0.77 | 10.37 |
| 15 | 0.83 | 8.15 | 0.77 | 10.41 |
| 16 | 0.83 | 8.30 | 0.79 | 10.88 |
| 17 | 0.82 | 8.15 | 0.77 | 10.29 |
| 18 | 0.80 | 8.22 | 0.76 | 10.00 |
| 19 | 0.83 | 8.34 | 0.75 | 10.38 |
| 20 | 0.84 | 8.41 | 0.78 | 11.02 |
| 21 | 0.81 | 8.24 | 0.79 | 10.55 |
| 22 | 0.82 | 8.31 | 0.79 | 10.77 |
| 23 | 0.82 | 8.18 | 0.77 | 10.33 |
| 24 | 0.80 | 8.03 | 0.79 | 10.15 |
| 25 | 0.82 | 8.11 | 0.79 | 10.51 |
| 26 | 0.82 | 8.35 | 0.77 | 10.54 |
| 27 | 0.83 | 8.41 | 0.76 | 10.61 |
| 28 | 0.78 | 8.49 | 0.77 | 10.20 |
| 29 | 0.82 | 8.16 | 0.79 | 10.57 |
| Comparative Example 1 | 0.72 | 8.05 | 0.69 | 7.99 |

As apparent from the above, it can be seen that the dye-sensitized solar cell of the present invention exhibited an excellent photoelectric conversion efficiency.

Aspects of the present invention are as follows, for example.

<1> A photoelectric conversion element including:

a first electrode;

a hole blocking layer;

an electron transport layer;

a first hole transport layer; and a second electrode, wherein the first hole transport layer includes at least one of basic compounds represented by general formula (1a) and general formula (1b) below:

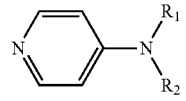

General formula (1a)

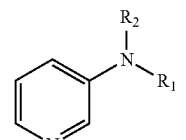

General formula (1b)

where in the formula (1a) or (1b), $R_1$ and $R_2$ represent a substituted or unsubstituted alkyl group or aromatic hydrocarbon group and may be identical or different, and $R_1$ and $R_2$ may bind with each other to form a substituted or unsubstituted heterocyclic group containing a nitrogen atom.

<2> The photoelectric conversion element according to <1>, wherein the electron transport layer includes an electron transport material photosensitized with a photosensitizing material represented by general formula (2) below:

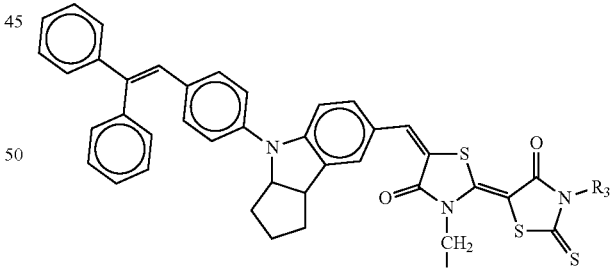

General formula (2)

where in the formula, $R_3$ represents a substituted or unsubstituted alkyl group.

<3> The photoelectric conversion element according to <2>, wherein the electron transport material is at least one selected from the group consisting of titanium oxide, zinc oxide, tin oxide, and niobium oxide.

<4> The photoelectric conversion element according to any one of <1> to <3>, wherein the hole blocking layer includes titanium oxide.

<5> The photoelectric conversion element according to any one of <1> to <4>, wherein the first hole transport layer includes an ionic liquid.
<6> The photoelectric conversion element according to <5>, wherein the ionic liquid includes an imidazolium compound.
<7> The photoelectric conversion element according to any one of <1> to <6>, further including
a second hole transport layer between the first hole transport layer and the second electrode, the second hole transport layer including a hole transportable polymer material.
<8> A solar cell including
the photoelectric conversion element according to any one of <1> to <7>.

The "solar cell" according to <8> includes a first electrode, a hole blocking layer, an electron transport layer, a first hole transport layer, and a second electrode, and uses at least one of basic materials represented by the general formula (1a) and the general formula (1b) in the first hole transport layer. This realizes a high internal resistance and a high open circuit voltage, and makes it possible to obtain a solar cell having a favorable characteristic under room light.

DESCRIPTION OF THE REFERENCE NUMERAL 1 substrate
2 first electrode fixing device
3 hole blocking layer
4 electron transport layer
5 photosensitizing compound
6 hole transport layer
7 second electrode
8 lead line
9 lead line

The invention claimed is:
1. A photoelectric conversion element comprising:
a first electrode;
an electron transport layer;
a first hole transport layer; and
a second electrode,
wherein the first hole transport layer comprises a lithium compound and at least one of basic compounds represented by formula (1a) and formula (1b):

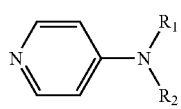

formula (1a)

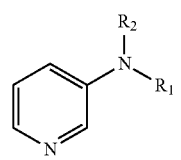

formula (1b)

where in the formula (1a) and (1b), $R_1$ and $R_2$ each independently represent a substituted or unsubstituted alkyl group or aromatic hydrocarbon group and may be identical or different, and $R_1$ and $R_2$ may bind with each other to form a substituted or unsubstituted heterocyclic group that comprises a nitrogen atom,
provided that the formula (1a) is not

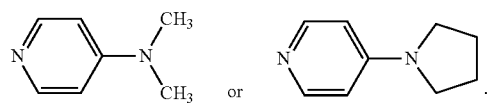

2. The photoelectric conversion element according to claim 1, wherein the electron transport layer comprises an electron transport material photosensitized with a photosensitizing material represented by formula (2) below:

formula (2)

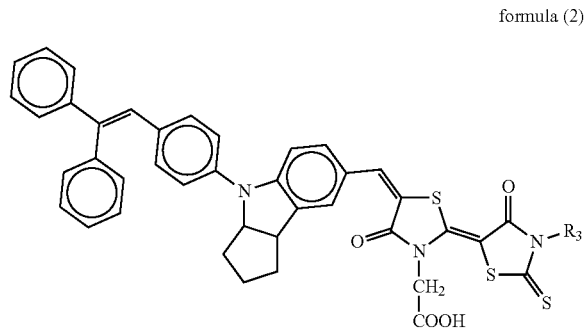

where in the formula (2), $R_3$ represents a substituted or unsubstituted alkyl group.

3. The photoelectric conversion element according to claim 2, wherein the electron transport material comprises at least one selected from the group consisting of titanium oxide, zinc oxide, tin oxide, and niobium oxide.

4. The photoelectric conversion element according to claim 1, further comprising:
a hole blocking layer between the first electrode and the electron transport layer,
wherein the hole blocking layer comprises titanium oxide.

5. The photoelectric conversion element according to claim 1, wherein the ionic liquid in the first hole transport layer comprises an imidazolium compound.

6. The photoelectric conversion element according to claim 1, further comprising:
a second hole transport layer between the first hole transport layer and the second electrode,
wherein the second hole transport layer comprises a hole transportable polymer material.

7. The photoelectric conversion element according to claim 1, wherein the lithium compound is lithium trifluoromethane sulfonylimide or lithium diisopropylimide.

8. The photoelectric conversion element according to claim 1, wherein the first hole transport layer includes a spirobifluorene-based compound.

9. The photoelectric conversion element according to claim 1, wherein the first hole transport layer further comprises an ionic liquid.

10. The photoelectric conversion element according to claim 1, wherein the first hole transport layer comprises a basic compound represented by the formula (1b).

11. The photoelectric conversion element according to claim 1,
wherein the first hole transport layer comprises a basic compound represented by the formula (1a), and
at least one of $R_1$ and $R_2$ in the formula (1a) represents a substituted or unsubstituted aromatic hydrocarbon group.

12. The photoelectric conversion element according to claim 1,
wherein the first hole transport layer comprises a basic compound represented by the formula (1a), and
in the formula (1a), $R_1$ and $R_2$ each independently represent an alkyl group substituted with an aromatic hydrocarbon group, or represent a substituted or unsubstituted aromatic hydrocarbon group.

13. The photoelectric conversion element according to claim 1, wherein in the formula (1a) or (1b), at least one of $R_1$ and $R_2$ represents a substituted or unsubstituted aromatic hydrocarbon group.

14. The photoelectric conversion element according to claim 1, wherein in the formula (1a) or (1b), $R_1$ and $R_2$ each independently represent an alkyl group substituted with an aromatic hydrocarbon group, or represent a substituted or unsubstituted aromatic hydrocarbon group.

15. A solar cell comprising
the photoelectric conversion element according to claim 1.

* * * * *